(12) United States Patent
Lub et al.

(10) Patent No.: US 9,115,869 B2
(45) Date of Patent: Aug. 25, 2015

(54) WAVELENGTH CONVERTING ELEMENT (75) Inventors: Johan Lub, Valkenswaard (NL); Rifat Ata Mustafa Hikmet, Eindhoven (NL); Rene Theodorus Wegh, Veldhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/131,939

(22) PCT Filed: Jun. 29, 2012

(86) PCT No.: PCT/IB2012/053326
§ 371 (c)(1),
(2), (4) Date: Jan. 10, 2014

(87) PCT Pub. No.: WO2013/008122
PCT Pub. Date: Jan. 17, 2013

(65) Prior Publication Data
US 2014/0153247 A1    Jun. 5, 2014

Related U.S. Application Data

(60) Provisional application No. 61/507,142, filed on Jul. 13, 2011.

(30) Foreign Application Priority Data

Jul. 13, 2011 (EP) .................................... 11173793

(51) Int. Cl.
C08G 73/06     (2006.01)
F21V 9/16      (2006.01)
C09K 11/06     (2006.01)
H05B 33/14     (2006.01)
H01L 51/00     (2006.01)
F21K 99/00     (2010.01)

(52) U.S. Cl.
CPC . F21V 9/16 (2013.01); C09K 11/06 (2013.01); H01L 51/00 (2013.01); H05B 33/14 (2013.01); C09K 2211/1466 (2013.01); F21K 9/56 (2013.01); H01L 51/0053 (2013.01)

(58) Field of Classification Search
CPC ................... C09K 2211/14; C09K 2211/1466; C09K 2211/1018; C09K 11/08; H05B 33/14; F21V 9/16; H01L 51/00; H01L 51/0053
USPC .................................. 528/423; 362/293, 351
See application file for complete search history.

(56) References Cited

U.S. PATENT DOCUMENTS

2003/0091862 A1    5/2003  Tokito
2007/0273274 A1   11/2007  Horiuchi

OTHER PUBLICATIONS

Lee C-W et al., "Synthesis and Properties of Violet Light-Emitting Polymeric Fluorophore", Dyes and Pigments, Elsevier Applied Science Publishers. Barking, GB, vol. 52, No. 1, Jan. 1, 2002, pp. 37-45, XP004329594.
Oh S Y et al., "Characteristics and Fabrication of Polymer Light Emitting Diode Using Copolymer Having Perylene and Triazine Moieties in the Polymer Side Chain", J. Ind. Eng. Chem., vol. 12, No. 1, 2006, pp. 69-75, XP002663914.

Primary Examiner — Shane Fang
(74) Attorney, Agent, or Firm — Yuliya Mathis (57) ABSTRACT

A wavelength converting element (110) comprising a polymeric material having a polymeric backbone, the polymeric material comprising a wavelength converting moiety, wherein the wavelength converting moiety is adapted to convert light of a first wavelength to light of a second wavelength, and wherein the wavelength converting moiety is covalently attached to the polymer backbone and/or covalently incorporated into the polymer backbone. The stability and lifetime of wavelength converting molecules comprised in a polymeric material may be improved by covalently attaching the wavelength converting moieties to the polymeric material.

12 Claims, 2 Drawing Sheets

WAVELENGTH CONVERTING ELEMENT

CROSS-REFERENCE TO PRIOR APPLICATIONS

This application is a U.S. national stage application under 35 U.S.C. §371 of international Application No. PCT/IB2012/053326 filed on Jun. 29, 2012, which claims the priority benefit under 35 U.S.C. §119(e) of U.S. Provisional Application No. 61/507,142 filed on Jul. 13, 2011 and of European Patent Application No. 11173793.8, filed on Jul. 13, 2011, the contents of which are herein incorporated by reference.

FIELD OF THE INVENTION

The present invention relates to a wavelength converting element comprising a polymeric material comprising a phosphor and a light-emitting device comprising such a light converting element.

BACKGROUND OF THE INVENTION

Light-emitting diode (LED) based illumination devices are increasingly used for a wide variety of lighting applications. LEDs offer advantages over traditional light sources, such as incandescent and fluorescent lamps, including long lifetime, high lumen efficacy, low operating voltage and fast modulation of lumen output.

Efficient high-power LEDs are often based on blue light emitting materials. To produce an LED based illumination device having a desired color (e.g., white) output, a suitable wavelength converting material, commonly known as a phosphor, may be used which converts part of the light emitted by the LED into light of longer wavelengths so as to produce a combination of light having desired spectral characteristics. The wavelength converting material may be applied directly on the LED die, or it may be arranged at a certain distance from the phosphor (so-called remote configuration).

Many inorganic materials have been used as phosphor materials for converting blue light emitted by the LED into light of longer wavelengths. However, inorganic phosphors suffer from the disadvantages that they are relatively expensive. Furthermore, inorganic phosphors are light scattering particles, thus always reflecting a part of the incoming light, which leads to loss of efficiency in a device. Furthermore, inorganic LED phosphors have limited quantum efficiency and a relatively broad emission spectrum, in particular for the red emitting LED phosphors, which leads to additional efficiency losses.

Currently, organic phosphor materials are being considered for replacing inorganic phosphor in LEDs where conversion of blue light to yellow/orange light is desirable, for example for achieving white light output. Organic phosphors have the advantage that their luminescence spectrum can be easily adjusted with respect to position and band width. Organic phosphor materials also often have a high degree of transparency, which is advantageous since the efficiency of the lighting system is improved compared to systems using more light-absorbing and/or reflecting phosphor materials. Furthermore, organic phosphors are much less costly than inorganic phosphors. However, since organic phosphors are sensitive to the heat generated during electroluminescence activity of the LED, organic phosphors are primarily used in remote configuration devices.

The main drawback hampering the application of organic phosphor materials in remote phosphor LED based lighting systems is their poor photo-chemical stability. Organic phosphors have been observed to degrade quickly when illuminated with blue light in the presence of air.

US2007/0273274 (Horiuchi et al.) discloses a translucent laminate sheet comprising a light-emitting device and comprising an organic phosphor arranged in an airproofed cavity. The cavity is filled with the organic phosphor in a state where the concentration of oxygen is kept at 100 ppm and preferably at 20 ppm or less in a vacuum or ambient atmosphere of inert gas, to avoid deterioration of the phosphor. However, performing this operation under such low concentrations of oxygen is difficult and costly.

Hence, there remains a need in the art for improved light-emitting devices employing organic phosphor materials.

SUMMARY OF THE INVENTION

In view of the above-mentioned and other drawbacks of the prior art, an object of the present invention is to provide a wavelength converting element comprising a phosphor having increased lifetime.

According to a first aspect of the invention, this and other objects are achieved by a wavelength converting element comprising a polymeric material having a polymeric backbone, the polymeric material comprising a wavelength converting moiety, wherein the wavelength converting moiety is adapted to convert light of a first wavelength to light of a second wavelength, and wherein the wavelength converting moiety is covalently attached to the polymer backbone and/or covalently incorporated into the polymer backbone.

The invention is based on the realization that the stability and lifetime of wavelength converting molecules comprised in a polymeric material may be improved by covalently attaching the wavelength converting moieties to the polymeric material. Thus, reducing the mobility of the wavelength converting molecules, and thereby also reducing the photo-chemical degradation of the wavelength converting molecules, as quenching thereof, by for example, aggregation is avoided.

The stability of an organic phosphor material may be improved by incorporation thereof in polymeric materials, and this has recently been described further in the non-published application (EP 10181066.1), hereby incorporated by reference. The inventors have surprisingly found that semi-crystalline polymers, such as aromatic polyesters, are particularly useful for this purpose as they have relatively low oxygen permeability after crystallization.

The inventive concept of covalently linking luminescent molecules is particularly advantageous when applied in semi-crystalline polymers as the mobility of the luminescent molecules are reduced and thereby avoiding that luminescent molecules are pushed out from the crystalline areas towards, for example, areas with polymer ends or areas with impurities, or towards each other, which may occur during crystallization of the semi-crystalline polymer, and may consequently decrease the lifetime of the luminescent molecules and even giving rise to concentration quenching thereof.

According to the invention, the polymeric material comprises a polyester or polyolefine.

According to the invention, the wavelength converting moiety is derived from a perylene.

In embodiments of the invention, the polymeric material having a polymeric backbone may comprise a random polyester copolymer comprising the wavelength converting moiety, the random polyester copolymer may comprise at least two different repeating units of the following general formula $n_1$, $n_2$, $n_3$, $n_4$:

$n_1$

$n_2$ $n_3$ $n_4$ wherein the repeating units may be randomly distributed along the length of the polymeric backbone, wherein AA may be selected from the following first group of aromatic moieties:

wherein BB may be selected from the following: —(CH$_2$)$_2$—, —(CH$_2$)$_4$— or wherein CC and DD may be the wavelength converting moieties having one of the following general formula I, II, or III:

I

II

III in which

G$_1$ may be a linear or branched alkyl group or oxygen-containing alkyl group C$_n$H$_{2n+1}$O$_m$, n being an integer from 1 to 44 and m<n/2, or Y, or a linking group;

each of A and C may independently be hydrogen, isopropyl, t-butyl, fluorine, methoxy, or unsubstituted saturated alkyl C$_n$H$_{2n+1}$, n being an integer from 1 to 16;

each of B, J and Q may independently be hydrogen, isopropyl, t-butyl, fluorine, methoxy, or unsubstituted saturated alkyl C$_n$H$_{2n+1}$, n being an integer from 1 to 16, or a linking group;

each of $G_2$, $G_3$, $G_4$ and $G_5$ may independently be hydrogen, fluorine, methoxy, or unsubstituted saturated alkyl group $C_nH_{2n+1}$, n being an integer from 1 to 16, or X, or a linking group;

each of $G_2$ and $G_3$ may independently be $C_1$ to $C_{12}$, preferably $C_1$ to $C_6$, linear, branched or cyclic alkoxy group, optionally bonded via the oxygen;

each of D and M may independently be hydrogen, fluorine, methoxy, or unsubstituted saturated alkyl group $C_nH_{2n+1}$, n being an integer from 1 to 16;

each of E, I and L may independently be hydrogen, fluorine, methoxy, or unsubstituted saturated alkyl group $C_nH_{2n+1}$, n being an integer from 1 to 16, or a linking group;

and each of T, T', R, R' may independently be hydrogen, isopropyl, t-butyl, fluorine, alkyloxy, aryloxy, cyano $CO_2R^x OCOR^x$ or unsubstituted saturated alkyl $C_nH_{2n+1}$, n being an integer from 1 to 16 and $R^x$ being aryl or saturated alkyl $C_nH_{2n+1}$, n being an integer from 1 to 16, or a linking group;

and wherein each wavelength converting moiety may comprise two linking groups at any two of the positions: $G_1$, $G_2$, $G_3$, $G_4$, $G_5$, E, I, L, B, J, Q, T, T', R, R', the linking groups providing covalent attachment of the wavelength converting moiety to the ester and/or alcohol functionalities of the random copolymer backbone.

Thereby, the wavelength converting moieties may be incorporated into the random copolymer backbone.

The content of the wavelength converting moieties in the random polyester copolymer may be adapted as desired by controlling the amount of repeating units comprising a wavelength converting moiety, i.e. the repeating unit of the general formula $n_2$ and $n_4$, with respect to the total amount of repeating units of the general formula $n_1$ and $n_3$. Typically, in the backbone of the random polyester copolymer the total number of the repeating unit of the general formula $n_1$ and $n_3$ may be larger than the total number of repeating units of the general formula $n_2$ and $n_4$, which both may comprise a wavelength converting moiety.

In embodiments of the invention, the random polyester copolymer may comprise a mixture of the repeating units: $n_1$, $n_3$ and $n_4$ (as given above), the repeating units may be randomly distributed along the length of the polymeric backbone, the total number of repeating units of formula $n_1$ and $n_3$ may be larger than the total number of repeating units of formula $n_4$ in the polymeric backbone.

In embodiments of the invention, the random polyester copolymer may be a mixture of the repeating units: $n_1$, $n_2$ and $n_4$ (as given above), the repeating units are randomly distributed along the length of the polymeric backbone, the total number of repeating units of formula $n_1$ may be larger than the total number of repeating units of formula $n_2$ and $n_4$ in the polymeric backbone.

In embodiments of the invention, the random polyester copolymer may comprise repeating units of at least two different repeating units of the general formula $n_1$, $n_2$, $n_3$, $n_4$ (as given above), wherein AA may be the following aromatic moiety:

In embodiments of the invention, the polymeric material having a polymeric backbone may comprise a random polyolefine copolymer comprising the wavelength converting moiety, the random polyolefine copolymer may comprise at least two different repeating units of the following general formula $m_1$ and $m_2$:

in which $X^1$ independently may be hydrogen, fluorine, chlorine, methyl or ethyl; $X^2$ independently may be hydrogen, methyl, hydroxide, acetate, nitrile, $C_6H_5$ or $CO_2 C_nH_{2n+1}$, n being 0 or an integer from 1 to 6; and $X^3$ may be a wavelength converting moiety having one of the following general formula I, II, or III:

in which $G_1$ may be a linear or branched alkyl group or oxygen-containing alkyl group $C_nH_{2n+1}O_m$, n being an integer from 1 to 44 and m<n/2, or Y, or a linking group;

each of A and C may independently be hydrogen, isopropyl, t-butyl, fluorine, methoxy, or unsubstituted saturated alkyl $C_nH_{2n+1}$, n being an integer from 1 to 16;

each of B, J and Q may independently be hydrogen, isopropyl, t-butyl, fluorine, methoxy, or unsubstituted saturated alkyl $C_nH_{2n+1}$, n being an integer from 1 to 16, or a linking group;

each of $G_2$, $G_3$, $G_4$ and $G_5$ may independently be hydrogen, fluorine, methoxy, or unsubstituted saturated alkyl group $C_nH_{2n+1}$, n being an integer from 1 to 16, or X, or a linking group;

each of D and M may independently be hydrogen, fluorine, methoxy, or unsubstituted saturated alkyl group $C_nH_{2n+1}$, n being an integer from 1 to 16;

each of E, I and L may independently be hydrogen, fluorine, methoxy, or unsubstituted saturated alkyl group $C_nH_{2n+1}$, n being an integer from 1 to 16, or a linking group;

and each of T, T', R, R' may independently be hydrogen, isopropyl, t-butyl, fluorine, alkyloxy, aryloxy, cyano $CO_2R^x OCOR^x$ or unsubstituted saturated alkyl $C_nH_{2n+1}$, n being an integer from 1 to 16 and $R^x$ being aryl or saturated alkyl $C_nH_{2n+1}$, n being an integer from 1 to 16, or a linking group;

wherein the repeating unit may be randomly distributed throughout the length of the random copolymer, the number of repeating units of formula $m_1$ may be larger than the number of repeating units of formula $m_2$ in the polymeric backbone;

and wherein each wavelength converting moiety may comprise one linking group at any one of the positions: $G_1$, $G_2$, $G_3$, $G_4$, $G_5$, E, I, L, B, J, Q, T, T', R, R', the linking group may comprise at least one of: —$CH_2$—, —O—, or —$CO_2$—, thereby providing a covalent attachment of the wavelength converting moiety to the polymer backbone of the polyolefine.

Thereby, the wavelength converting moieties may be attached as a side chain to the polymer backbone.

The content of the wavelength converting moieties in the random polyolefine copolymer may be adapted as desired by controlling the amount of repeating units comprising a wavelength converting moiety, i.e. the repeating unit of the general formula $m_2$, with respect to the total amount of repeating units of the general formula $m_1$.

In embodiments of the invention, the random polyolefine copolymer may comprise the at least two different repeating units of the general formula $m_1$ and $m_2$ (as given above), wherein $X^1$ may independently be hydrogen, chlorine, methyl; $X^2$ may independently be $C_6H_5$ or $CO_2$ $C_nH_{2n+1}$, n being 0 or an integer from 1 to 6, or nitrile, and $X^3$ may be the wavelength converting moiety wherein the linking group may comprise —$CO_2$— for covalent attachment of the wavelength converting moiety to the polymer backbone of the random polyolefine copolymer.

In one embodiment of the invention, the wavelength converting moiety may have one of the general formula I or II (as shown above) comprising one linking group at one of the positions: $G_1$, B, J, or Q.

In embodiments of the invention, the polymeric material may comprise a random polyester or random polyolefine copolymer, comprising first repeating units selected from general formula $n_1$, $n_2$, $n_3$, and $n_4$, or $m_1$ and $m_2$ (as given above), wherein the first repeating units of the general formula $n_2$, $n_4$ or $m_2$ may comprise a first wavelength converting moiety of one of the general formula I, II or III (as given above), and comprising a second repeating units selected from the general formula $n_1$, $n_2$, $n_3$, and $n_4$, or $m_1$ and $m_2$, wherein the second repeating units of the general formula $n_2$, $n_4$ or $m_2$ may comprise a second wavelength converting moiety of one of the general formula I, II or III, wherein the first and second wavelength converting moieties may be different.

By using more than one type of wavelength converting molecule having different optical properties the spectral composition of the converted light can be more conveniently adapted as desired.

In embodiments of the invention, the content of the wavelength converting moieties in the polymeric material may preferably be 10% or less by weight, for example 1% or less by weight, such as 0.1% or less by weight. As discussed above, a desirable content of the wavelength converting moieties in the polymeric material may be achieved by adapting the total number of repeating units containing a wavelength converting moiety, i.e. repeating units of the general formula $n_2$, $n_4$ and $m_2$, respectively, with respect to the total number of non-containing repeating units of the general formula $n_1$, $n_3$ and $m_1$, respectively.

Furthermore, by the term "randomly distributed" should, in the context of this application, be understood as distributed according to a statistical distribution, as would be expected for a random copolymerization giving a random copolymer.

In embodiments of the wavelength converting element according to the invention, the polymeric material may be in the form of a film.

Furthermore, the wavelength converting element according to the present invention may advantageously be comprised in a light-emitting device further comprising a light source adapted to emit light of a first wavelength, wherein the wavelength converting element may be arranged to receive light of the first wavelength and adapted to convert at least part of the light of the first wavelength to light of a second wavelength.

In embodiments of the invention the light source and the wavelength converting member may be arranged mutually spaced apart.

In embodiments of the invention light source may be a solid state light emitter such as a LED or laser emitting blue, violet or UV light.

It is noted that the invention relates to all possible combinations of features recited in the claims.

BRIEF DESCRIPTION OF THE DRAWINGS

This and other aspects of the present invention will now be described in more detail, with reference to the appended drawings showing exemplary embodiment(s) of the invention, wherein.

DESCRIPTION OF EXAMPLE EMBODIMENTS OF THE INVENTION

In the following description, the present invention is described with reference to a wavelength converting element and a light-emitting device comprising such wavelength converting element.

The inventors have surprisingly found that improved stability and lifetime of wavelength converting molecules comprised in a wavelength converting element is achieved through a polymeric material comprising wavelength converting moieties covalently attached to or incorporated into the polymer backbone of the polymeric material and thereby reducing the mobility of the wavelength converting moieties such that aggregation and quenching thereof is avoided.

Figure 1:
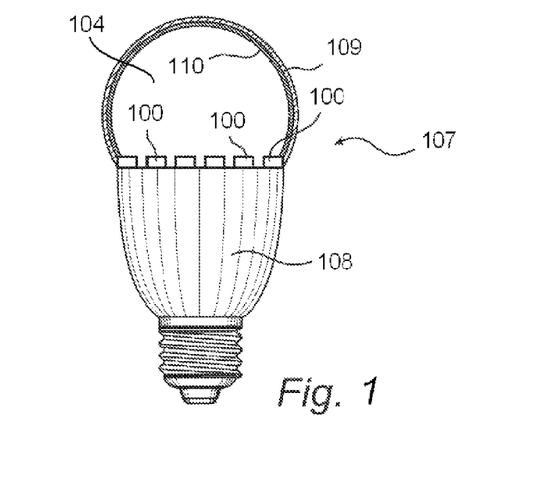
FIG. 1 shows a side view of an exemplary embodiment according the invention.

FIG. 1 shows an LED based light-emitting device according to an embodiment of the invention. The light-emitting device of this embodiment is provided as a retrofit lamp 107. The phrase retrofit lamp is well known to the person skilled in the art and refers to an LED based lamp having an outer appearance of an older type of lamp which did not have an LED. The lamp 107 comprises a base part 108, which is provided with a traditional cap 108, such as an Edison screw cap or a bayonet cap. Further, the lamp 107 has a bulb shaped light outlet member 109 enclosing a cavity 104. A plurality of LEDs 100 are arranged on the base part 108 within the cavity 104. A wavelength converting element 110 is arranged on the inside of the light outlet member 109, i.e. on the side of the light outlet member facing the cavity 104.

The wavelength converting element may be applied as a coating on the light outlet member. It is also contemplated that the wavelength converting member may be a self-supporting layer, such as a film or sheet standing free from the light outlet member and having any suitable shape. Alternatively, it may be shaped as a hood member covering the LEDs at a certain distance from the LEDs and from the light outlet member.

The atmosphere within the cavity 104 may be air, or it may be controlled so as to have a certain composition. For example, the cavity 104 may be filled with an inert gas such as nitrogen or a noble gas e.g. argon. In embodiments of the invention, the oxygen concentration within the cavity 104 may be kept at a low level, e.g. at 20% or less, at 15% or less, at 10% or less, at 5% or less, at 3% or less, 1% or less, 0.6% or less, and preferably at 0.1% or less, by total volume of the sealed cavity.

In embodiments of the wavelength converting element according to the invention, the polymeric material may comprise a polyester or polyolefine whereas the wavelength converting moiety may be derived from a perylene.

The polymeric material may, for example, be a random polyester copolymer comprising the wavelength converting moiety, the random polyester copolymer may comprise at least two different repeating units of the following general formula $n_1$, $n_2$, $n_3$, $n_4$:

wherein the repeating units may be randomly distributed along the length of the polymeric backbone, wherein AA may be selected from the following first group of aromatic moieties:

wherein BB may be selected from the following: —(CH$_2$)$_2$—, —(CH$_2$)$_4$— or wherein CC and DD may be the wavelength converting moieties having one of the following general formula I, II, or III:

in which
G₁ may be a linear or branched alkyl group or oxygen-containing alkyl group
$C_nH_{2n+1}O_m$, n being an integer from 1 to 44 and m≤n/2, or Y, or a linking group;

each of A and C may independently be hydrogen, isopropyl, t-butyl,
fluorine, methoxy, or unsubstituted saturated alkyl $C_nH_{2n+1}$, n being an integer from 1 to 16;

each of B, J and Q may independently be hydrogen, isopropyl, t-butyl,
fluorine, methoxy, or unsubstituted saturated alkyl $C_nH_{2n+1}$, n being an integer from 1 to 16, or a linking group;

each of G₂, G₃, G₄ and G₅ may independently be hydrogen, fluorine, methoxy, or
unsubstituted saturated alkyl group $C_nH_{2n+1}$, n being an integer from 1 to 16, or X, or a linking group;

each of D and M may independently be hydrogen, fluorine, methoxy, or unsubstituted saturated alkyl group $C_nH_{2n+1}$, n being an integer from 1 to 16;

each of E, I and L may independently be hydrogen, fluorine, methoxy, or unsubstituted saturated alkyl group $C_nH_{2n+1}$, n being an integer from 1 to 16, or a linking group;

and each of T, T', R, R' may independently be hydrogen, isopropyl, t-butyl,
fluorine, alkyloxy, aryloxy, cyano $CO_2R^xOCOR^x$ or unsubstituted saturated alkyl $C_nH_{2n+1}$, n being an integer from 1 to 16 and $R^x$ being aryl or saturated alkyl $C_nH_{2n+1}$, n being an integer from 1 to 16, or a linking group;

and wherein each wavelength converting moiety may comprise two linking groups at any two of the positions: G₁, G₂, G₃, G₄, G₅, E, I, L, B, J, Q, T, T', R, R', the linking groups providing covalent attachment of the wavelength converting moiety to the ester and/or alcohol functionalities of the random copolymer backbone.

Alternatively, the polymeric material may be a random polyolefine copolymer comprising the wavelength converting moiety, the random polyolefine copolymer may comprise at least two different repeating units of the following general formula m₁ and m₂:

in which
X¹ independently may be hydrogen, fluorine, chlorine, methyl or ethyl; X² independently may be hydrogen, methyl, hydroxide, acetate, nitrile, $C_6H_5$ or $CO_2C_nH_{2n+1}$, n being 0 or an integer from 1 to 6; and X³ may be a wavelength converting moiety having one of the following general formula I, II, or III:

in which
G₁ may be a linear or branched alkyl group or oxygen-containing alkyl group $C_nH_{2n+1}O_m$, n being an integer from 1 to 44 and m<n/2, or Y, or a linking group;

each of A and C may independently be hydrogen, isopropyl, t-butyl, fluorine, methoxy, or unsubstituted saturated alkyl $C_nH_{2n+1}$, n being an integer from 1 to 16;

each of B, J and Q may independently be hydrogen, isopropyl, t-butyl, fluorine, methoxy, or unsubstituted saturated alkyl $C_nH_{2n+1}$, n being an integer from 1 to 16, or a linking group;

each of $G_2$, $G_3$, $G_4$ and $G_5$ may independently be hydrogen, fluorine, methoxy, or unsubstituted saturated alkyl group $C_nH_{2n+1}$, n being an integer from 1 to 16, or X, or a linking group;

each of D and M may independently be hydrogen, fluorine, methoxy, or unsubstituted saturated alkyl group $C_nH_{2n+1}$, n being an integer from 1 to 16;

each of E, I and L may independently be hydrogen, fluorine, methoxy, or unsubstituted saturated alkyl group $C_nH_{2n+1}$, n being an integer from 1 to 16, or a linking group;

and each of T, T', R, R' may independently be hydrogen, isopropyl, t-butyl, fluorine, alkyloxy, aryloxy, cyano $CO_2R^xOCOR^x$ or unsubstituted saturated alkyl $C_nH_{2n+1}$, n being an integer from 1 to 16 and $R^x$ being aryl or saturated alkyl $C_nH_{2n+1}$, n being an integer from 1 to 16, or a linking group;

wherein the repeating unit may be randomly distributed throughout the length of the random copolymer, the number of repeating units of formula $m_1$ may be larger than the number of repeating units of formula $m_2$ in the polymeric backbone;

and wherein each wavelength converting moiety may comprise one linking group at any one of the positions: $G_1$, $G_2$, $G_3$, $G_4$, $G_5$, E, I, L, B, J, Q, T, T', R, R', the linking group may comprise at least one of: —$CH_2$—, —O—, or —$CO_2$—, thereby providing a covalent attachment of the wavelength converting moiety to the polymer backbone of the polyolefine.

Thus, random copolymers having either wavelength converting moieties covalently incorporated into the polymer backbone or covalently attached as a side-chain to the polymer back bone are exemplified above by the random copolyester and the random polyolefine copolymer. In both examples, the wavelength converting moieties are randomly distributed within or along the length of the polymer backbone, that is, the copolymer is a so-called statistical copolymer or random copolymer as a result from a random copolymerization.

Advantageously, the polymeric material may comprise a random polyester or random polyolefine copolymer, comprising first repeating units of the general formula $n_1$, $n_2$, $n_3$, $n_4$, or $m_1$ and $m_2$ (as given above), wherein the first repeating units of the general formula $n_2$, $n_4$ or $m_2$ may comprise a first wavelength converting moiety of one of the general formula I, II or III (as given above), and comprising a second repeating units of the general formula $n_1$, $n_2$, $n_3$, $n_4$, or $m_1$ and $m_2$, wherein the second repeating units of the general formula $n_2$, $n_4$ or $m_2$ may comprise a second wavelength converting moiety of one of the general formula I, II or III, wherein the first and second wavelength converting moieties may be different. Thereby the composition of wavelength converting molecules in the polymeric material may be adapted to achieve a desirable wavelength conversion.

Alternatively, the first repeating unit may comprise wavelength converting moieties having the same general formula I, II or III as the general formula of the wavelength converting moieties comprised in the second repeating unit, but having a different substituent in or more of the positions $G_1$, $G_2$, $G_3$, $G_4$, $G_5$, A, B, C, D, E, I, L, M, J, Q, T, T', R, and R'.

In an embodiment of the invention, the random polyester copolymer may comprise different repeating units of the general formula $n_1$ and $n_4$ (as given above), wherein AA may be and wherein the wavelength converting moiety may have the general formula I (as given above), wherein $G_1$ may be Y, $G_2$, $G_3$, $G_4$, $G_5$ may be phenol, and wherein A and C may be isopropyl, B and Q may be hydrogen, and J may be a propylene linking group.

In another embodiment of the invention, the random polyolefine copolymer may comprise two different repeating units of the general formula $m_1$ and $m_2$ (as given above), wherein $X^1$ may be methyl; $X^2$ may be acetate; and $X^3$ may be the wavelength converting element having the general formula II (as given above), wherein $G_1$ may be Y and $G_2$, $G_3$, $G_4$, $G_5$ may be hydrogen, T may be nitrile, R may be hydrogen, and wherein A and C may be isopropyl, B and Q may be hydrogen, and J may be a —$(CH_2)_3OCO$— linking group.

The concentration of the wavelength converting moieties in the polymeric material may be 1% or less by weight, preferably 0.1% or less by weight, and more preferably 0.01% or less by weight, based on the total weight of the wavelength converting moieties and the polymeric material. Thus, typically only a fraction of the repeating units of the above described polymers are of the general formula $n_2$, $n_4$ and $m_2$, i.e. comprise a wavelength converting moiety.

The advantages of the method according to the present invention have been demonstrated in experiments.

EXAMPLE 1

Figure 2A:
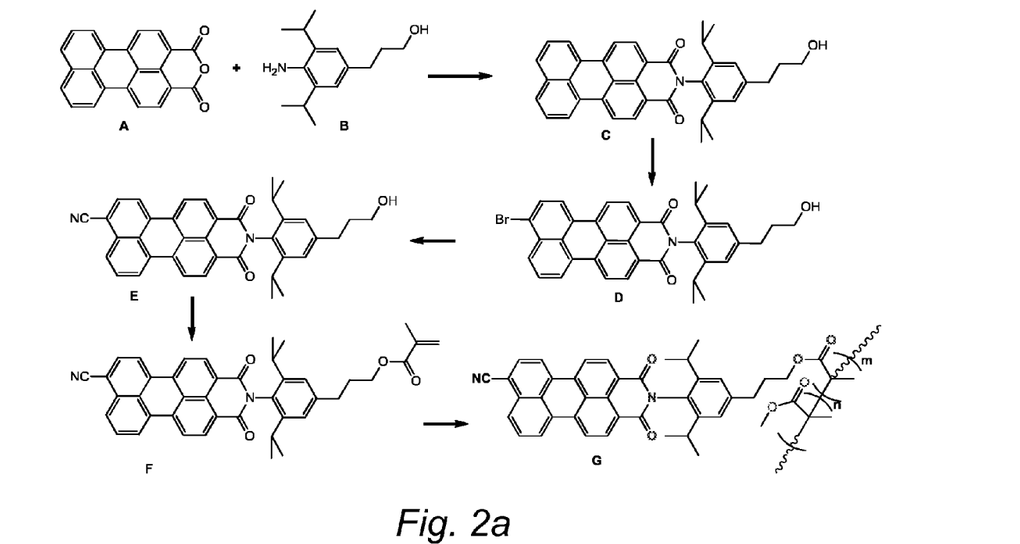
FIGS. 2a-b show schemes of the syntheses of two examples embodiment of the polymeric material according the invention.

As shown in FIG. 2a, a random copolymer G was prepared by copolymerization of methyl methacrylate (MMA) and polymerizable dye monomer F.

Compounds A and B were obtained according to: Feiler, Leonhard; Langhals, Heinz; Polborn, Kurt From Liebigs Annalen (1995), (7), 1229-44 and: Schrekker, Henri S.; Kotov, Vasily; Preishuber-Pflugl, Peter; White, Peter; Brookhart, Maurice From Macromolecules (2006), 39(19), 6341-6354, respectively.

N-(4-(3-Hydroxypropyl)-2,6-diisopropylphenyl) perylene-3,4-dicarboximide (C). Perylene A (300 mg, 0.93 mmol), aniline B (250 mg, 1.06 mmol) and zinc acetate dihydrate (233 mg, 1.06 mmol) were mixed with imidazole (7 g). The reaction mixture was stirred at 160° C. for 20 h under nitrogen. After cooling to room temperature, 1 N HCl (100 mL) was added and the aqueous layer was extracted with DCM (6×80 mL). the combined organic layers were washed with water, dried over $Na_2SO_4$, filtered and the solvent removed in vacuo. Purification by column chromatography ($SiO_2$) with DCM afforded C (260 mg, 51% yield) as red solid.

9-Bromo-N-(4-(3-Hydroxypropyl)-2,6-diisopropylphenyl)perylene-3,4-dicarboximide (D). A solution of C (600 mg, 1.1 mmol) in chlorobenzene (125 mL) was treated with anhydrous $K_2CO_3$ (691 mg, 5.0 mmol) followed by $Br_2$ (0.260 mL, 5.0 mmol). The mixture was stirred at 55° C. for 5 h and the solvent and excess bromide were removed under vacuum. The crude residue was dissolved in a mixture of DCM and water and the aqueous layer was extracted with DCM (3×), washed with water, dried over $Na_2SO_4$, filtered and the solvent removed in vacuo. Purification by column chromatography ($SiO_2$, eluent: DCM/MeOH=40/1) gave compound D (540 mg, 78% yield) as an orange solid.

9-Cyano-N-(4-(3-Hydroxypropyl)-2,6-diisopropylphenyl)perylene-3,4-dicarboximide (E). Copper (I) cyanide (70 mg, 0.78 mmol) was added to a solution of D (240 mg, 0.39 mmol) in sulfolane (2 mL) under nitrogen. The mixture was stirred at 220° C. for 40 h then cooled to room temperature, diluted with DCM, washed with 5% aqueous ammonia, brine and the DCM solution was dried over $Na_2SO_4$, filtered and the solvent removed in vacuo. Purification by column chromatography ($SiO_2$, eluent: DCM/EtOAc=20/1 to 20/4) gave compound E (182 mg, 82% yield) as an orange solid.

9-Cyano-N-(4-(3-methacryloyloxypropyl)-2,6-diisopropylphenyl)perylene-3,4-dicarboximide (F). A solution of E (80 mg, 0.142 mmol) in THF (25 mL) was warmed until a clear solution was obtained then it was let cool to room temperature. $Et_3N$ (100 µL, 0.72 mmol) and a few crystals of BHT were added. The solution was cooled to 5° C. with an ice-water bath and methacryloyl chloride (8 µL, 0.08 mmol) was added drop wise. The mixture was then stirred overnight at room temperature in the dark. The solvents were evaporated in vacuo and the compound purified by column chromatography ($SiO_2$). Elution with DCM then with DCM/EtOAc=125/1 afforded target compound F (35 mg, 41% yield) as a dark red powder.

Poly(9-Cyano-N-(4-(3-methacryloyloxypropyl)-2,6-diisopropylphenyl)perylene-3,4-dicarboximide-co-methylmethacrylate) (G) A mixture of 10 ml methyl methacrylate (93.5 mmol), 7.5 mg (0.012 mmol) (F), 150.2 mg AIBN (0.91 mmol) and 40 ml toluene was left evacuated after three freeze-daw cycles and then heated at 70° C. for 16 hours. After cooling the polymer was precipitated in 200 ml of methanol, redissolved in 22 ml of dichloromethane and precipitated in 110 ml of methanol. After drying in vacuo at 70° C. for 24 hours 5.95 g of a yellow powder was obtained. (mn=31400, mw=55400).

The amount of polymerizable dye F was 0.08% W/W. A polymer film (film 1) was formed by coating from a dichloromethane solution. The thickness of the layer was set so that the transmission of blue light was 90%. Another polymer with the same molecular weight was formed from pure MMA. This polymer was mixed with the corresponding amount (as of dye F above) of non-polymerisable dye F-170 (obtained from BASF, Ludwigshafen) and a film (film 2) was made in the same manner as described above.

Both films exhibited equal optical properties. The lifetime of both films was tested under illumination with blue light at 4.1/W/cm² at 60° C. The lifetime is estimated as 10% reduction in the luminescence intensity. Film 1 prepared from the copolymer showed a two times longer lifetime than film 2 prepared from the (non-copolymerized) mixture of the polymer and F-170 (BASF).

EXAMPLE 2

Figure 2B:
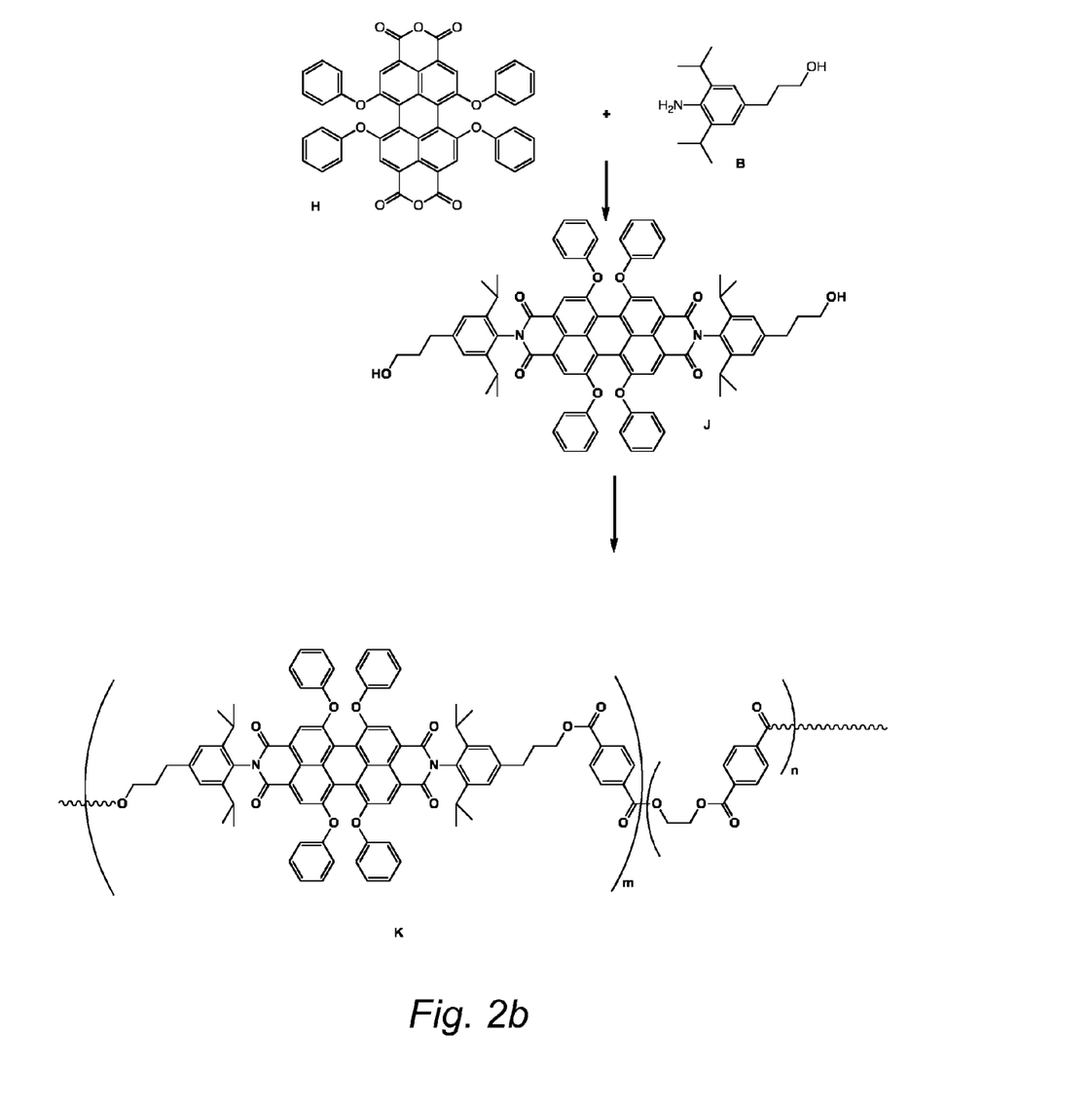

As shown in FIG. 2b, a random copolymer K was prepared by polycondensation of a mixture of polymerizable dye monomer J, glycol and dimethylterpthalate.

Compound H was prepared according to: Dotcheva, Dobrinka; Klapper, Markus; Muellen, Klaus, Macromolecular Chemistry and Physics (1994), 195(6), 1905-11

N,N'-Bis-(4-(3-hydroxypropyl)-2,6-diisopropylphenyl)-1,6,7,12-tetrapheno xyperylene-3,4,9,10-tetracarboxdiimide J:

1,6,7,12-tetraphenoxyperylene-3,4:9,10-tetracarboxy-3,4,9,10-bisanhydride H (600 mg, 0.79 mmol), zinc acetate dihydrate (351.2 mg, 1.60 mmol) and aniline B (1.6 g, 6.8 mmol) were mixed with imidazole (10 g). The reaction mixture was stirred at 150° C. (ext) for 24 h under nitrogen. After cooling to room temperature, 1 N HCl aq was added to the mixture until an acidic pH was obtained. The resulting mixture was extracted with DCM (4×). the combined DCM solution was dried with Na2SO4. After evaporation of the solvent, the crude product was purified by silica gel column chromatography eluting with DCM to CM/MeOH=40/1 to give perylene bisimide J (220 mg, 23% yield) as a dark purple solid.

Co-Polyester K. A mixture of 2.9 mg of J, 101 g of dimethyl terphthalate 50 g of ethylene glycol, 0.08 g of calcium acetate dehydrate and 0.015 g of antimony trioxide was heated under a flow of nitrogen in a polymerization reactor at 200° C. for three hours. Then vacuum was applied and reaction was continued for 4 hours while the temperature steadily increased until 280° C. while the excess ethylene glycol was distilled off. Upon cooling a red solid was obtained.

A film (film 3), made by extrusion of this polymeric materials was formed. The thickness of the layer was set so that the transmission of blue light was 90%.

PET was made in the same manner as described above but omitting compound J. This polymer was mixed with the corresponding amount (as of dye J above) of the structurally very similar non-copolymerizable dye F-305 (BASF, Ludwigshaven) and a film (film 4) was prepared in the same manner as described above such that film 4 had equal optical properties as film 3 prepared from the copolymer.

In order to test the lifetime, both films were illuminated with blue light at 4.1/W/cm² at 60° C. The lifetime is estimated as 10% reduction in the luminescence intensity. Film 3 prepared from the copolymer showed a three times longer lifetime than film 4 prepared from the (non-copolymerized) mixture of PET and F-305. The person skilled in the art realizes that the present invention by no means is limited to the preferred embodiments described above. On the contrary, many modification and variations are possible within the scope of the appended claims. For example, each wavelength converting moiety may comprise two or more linking group at any one of the positions: $G_1$, $G_2$, $G_3$, $G_4$, $G_5$, E, I, L, B, J, Q, T, T', R, R', and thereby achieving cross-linkage between polymeric backbones giving rise so-called polymeric network.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

The invention claimed is:
1. A wavelength converting element comprising a polymeric material having a polymeric backbone, said polymeric material comprising a wavelength converting moiety, wherein said wavelength converting moiety is adapted to convert light of a first wavelength to light of a second wavelength, and wherein said wavelength converting moiety is covalently attached to said polymer backbone, wherein said polymeric material having a polymeric backbone comprises a random polyester copolymer comprising said wavelength converting moiety, said random polyester copolymer comprising at least three different repeating units of the following general formula $n_1$, $n_2$, $n_3$, $n_4$:

wherein said repeating units are randomly distributed along the length of said polymeric backbone, wherein AA is selected from the following first group of aromatic moieties:

wherein BB is selected from the following: —(CH$_2$)$_2$—, —(CH$_2$)$_4$— or

—CH$_2$—⬡—CH$_2$—, wherein CC and DD are said wavelength converting moieties having one of the following general formula I, II, or III:

in which
G$_1$ is a linear or branched alkyl group or oxygen-containing alkyl group
C$_n$H$_{2n+1}$O$_m$, n being an integer from 1 to 44 and m <n/2, or Y, or a linking group;
each of A and C independently is hydrogen, isopropyl, t-butyl,
fluorine, methoxy, or unsubstituted saturated alkyl C$_n$H$_{2n+1}$, n being an integer from 1 to 16;
each of B, J and Q independently is hydrogen, isopropyl, t-butyl, fluorine, methoxy, or unsubstituted saturated alkyl C$_n$H$_{2n+1}$, n being an integer from 1 to 16, or a linking group;
each of G$_2$, G$_3$, G$_4$ and G$_5$ independently is hydrogen, fluorine, methoxy, or
unsubstituted saturated alkyl group C$_n$H$_{2n+1}$, n being an integer from 1 to 16, or X, or OX, wherein D, M, E, L and I are hydrogen, or a linking group;

each of $G_2$ and $G_3$ may independently be $C_1$ to $C_{12}$ linear, branched or cyclic alkoxy group, optionally bonded via the oxygen;

each of D and M independently is hydrogen, fluorine, methoxy, or unsubstituted saturated alkyl group $C_nH_{2n+1}$, n being an integer from 1 to 16;

each of E, I and L independently is hydrogen, fluorine, methoxy, or unsubstituted saturated alkyl group $C_nH_{2n+1}$, n being an integer from 1 to 16, or a linking group;

and each of T, T', R, R' independently is hydrogen, isopropyl, t-butyl, fluorine, alkyloxy, aryloxy, cyano $CO_2R^x$ $OCOR^x$ or unsubstituted saturated alkyl $C_nH_{2n+1}$, n being an integer from 1 to 16 and $R^x$ being aryl or saturated alkyl $C_nH_{2n+1}$, n being an integer from 1 to 16, or a linking group;

and wherein each wavelength converting moiety comprises two linking groups at any two of the positions: $G_1$, $G_2$, $G_3$, $G_4$, $G_5$, E, I, L, B, J, Q, T,T', R, R', said linking groups providing covalent attachment of said wavelength converting moiety to the ester and/or alcohol functionalities of said polymer backbone;

and wherein said random polyester copolymer comprises either a mixture of said repeating units $n_1$, $n_3$ and $n_4$ or a mixture of said repeating units $n_1$, $n_2$ and $n_4$, said repeating units are randomly distributed along the length of said polymeric backbone, and the total number of the repeating units of the general formula $n_1$ and $n_3$ is larger than the total number of repeating units of the general formula $n_2$ and $n_4$.

2. The wavelength converting element according to claim 1, wherein said random polyester copolymer comprises a mixture of said repeating units: $n_1$, $n_3$ and $n_4$, said repeating units are randomly distributed along the length of said polymeric backbone, and the total number of repeating units of formula $n_1$ and $n_3$ is larger than the total number of repeating units of formula $n_4$ in the polymeric backbone.

3. The wavelength converting element according to claim 1, wherein said random polyester copolymer comprises a mixture of said repeating units: $n_1$, $n_2$ and $n_4$, said repeating units are randomly distributed along the length of the polymeric backbone, and the total number of repeating units of formula $n_1$ is larger than the total number of repeating units of formula $n_2$ and $n_4$ in the polymeric backbone.

4. The wavelength converting element according to claim 1, wherein AA is the following aromatic moiety:

5. A wavelength converting element comprising a polymeric material having a polymeric backbone, said polymeric material comprising a wavelength converting moiety, wherein said wavelength converting moiety is adapted to convert light of a first wavelength to light of a second wavelength, and wherein said wavelength converting moiety is covalently attached to said polymer backbone, wherein said polymeric material having a polymeric backbone comprises a random polyolefine copolymer comprising said wavelength converting moiety, said random polyolefine copolymer comprising at least two different repeating units of the following general formula $m_1$ and $m_2$:

in which
$X^1$ independently is hydrogen, fluorine, chlorine, methyl or ethyl; $X^2$ independently is hydrogen, methyl, hydroxide, acetate, nitrile, $C_6H_5$ or $CO_2$ $C_nH_{2n+1}$, n being 0 or an integer from 1 to 6; and $X^3$ is said wavelength converting moiety having one of the following general formula I and II:

in which
$G_1$ is a linear or branched alkyl group or oxygen-containing alkyl group $C_nH_{2n+1}O_m$, n being an integer from 1 to 44 and m<n/2, or Y, or a linking group;

each of A and C independently is hydrogen, isopropyl, t-butyl, fluorine, methoxy, or unsubstituted saturated alkyl $C_nH_{2n+1}$, n being an integer from 1 to 16;

each of B, J and Q independently is hydrogen, isopropyl, t-butyl, fluorine, methoxy, or unsubstituted saturated alkyl $C_nH_{2n+1}$, n being an integer from 1 to 16, or a linking group;

each of $G_2$, $G_3$, $G_4$ and $G_5$ independently is hydrogen, fluorine, methoxy, or unsubstituted saturated alkyl group $C_nH_{2n+1}$, n being an integer from 1to 16, or X, or a linking group;

each of D and M independently is hydrogen, fluorine, methoxy, or unsubstituted saturated alkyl group $C_nH_{2n+1}$, n being an integer from 1to 16;

each of E, I and L independently is hydrogen, fluorine, methoxy, or unsubstituted saturated alkyl group $C_nH_{2n+}$, n being an integer from 1to 16, or a linking group;

and each of T, T', R, R' independently is hydrogen, isopropyl, t-butyl, fluorine, alkyloxy, aryloxy, cyano $CO_2R^xOCOR^x$ or unsubstituted saturated alkyl $C_nH_{2n+1}$, n being an integer from 1 to 16 and $R^x$ being aryl or saturated alkyl $C_nH_{2n+l}$, n being an integer from 1 to 16, or a linking group;

wherein said repeating unit are randomly distributed throughout the length of the random copolymer, the number of repeating units of formula $m_1$ is larger than the number of repeating units of formula $m_2$ in the polymeric backbone;

and wherein each wavelength converting moiety comprises one linking group at one of the positions: $G_1$, B, J, or Q, said linking group comprises at least one of: —$CH_2$—, —O —, or —$CO_2$—, thereby providing a covalent attachment of said wavelength converting moiety to the polymer backbone of said polyolefine.

6. The wavelength converting element according to claim 5, wherein said random polyolefine copolymer comprises said at least two different repeating units of the said general formula $m_1$ and $m_2$, wherein $X^l$ independently is hydrogen, chlorine, methyl; $X^2$ independently is $C_6H_5$ or $CO_2 C_nh_{2n+l}$, n being 0 or an integer from 1 to6, or nitrile, and $X^3$ is said wavelength converting moiety wherein said linking group comprises —$CO_2$— for covalent attachment of said wavelength converting moiety to the polymer backbone of said polyolefine.

7. The wavelength converting element according to claim 5, wherein the polymeric material comprises random polyolefine copolymer, comprising first repeating units selected from the general formula $m_1$ and $m_2$, wherein the first repeating units of the general formula $m_2$ comprise a first wavelength converting moiety of one of the general formula I or II, and comprising a second repeating units selected from the general formula $m_1$ and $m_2$ wherein the second repeating units of the general formula $m_2$ comprise a second wavelength converting moiety of one of the general formula I or II, wherein the first and second wavelength converting moieties are different.

8. The wavelength converting element according to claim 1, wherein said random polyester copolymer comprising different repeating units of said general formula $n_1$ and $n_4$, wherein AA is and wherein said wavelength converting moiety having said general formula I, wherein $G_1$ is Y and $G_2$, $G_3$, $G_4$, $G_5$ are phenol, and wherein A and C are isopropyl, B and Q are hydrogen, and J is a propylene linking group.

9. The wavelength converting element according to claim 5, wherein said random polyolefine copolymer comprising said two different repeating units of said general formula $m_1$ and $m_2$, wherein $X^1$ is methyl; $X^2$ is acetate; and $X^3$ is said wavelength converting element having said general formula II, wherein $G_1$ is Y and $G_2$, $G_3$, $G_4$, $G_5$ are hydrogen, T is nitrile, R is hydrogen, and wherein A and C are isopropyl, B and Q are hydrogen, and J is a —$(CH_2)_3OCO$— linking group.

10. The wavelength converting element to claim 5 wherein the content of said wavelength converting moiety in said polymeric material is 10 % or less by weight, such as 1% or less by weight.

11. The wavelength converting element according to claim 5 wherein said wavelength converting moiety is derived from a perylene.

12. A light-emitting device comprising a light-source adapted to emit light of a first wavelength, and a wavelength converting element according to claim 5 wherein said wavelength converting element is arranged to receive light of said first wavelength and adapted to convert at least part of the light of said first wavelength to light of a second wavelength.

* * * * *